United States Patent

Bershteyn et al.

[11] Patent Number: 5,678,028
[45] Date of Patent: Oct. 14, 1997

[54] HARDWARE-SOFTWARE DEBUGGER USING SIMULATION SPEED ENHANCING TECHNIQUES INCLUDING SKIPPING UNNECESSARY BUS CYCLES, AVOIDING INSTRUCTION FETCH SIMULATION, ELIMINATING THE NEED FOR EXPLICIT CLOCK PULSE GENERATION AND CACHING RESULTS OF INSTRUCTION DECODING

[75] Inventors: Mikhail Bershteyn, Campbell; Ross Thomas Casley, Palo Alto; Chiahon Chien, Saratoga; Abhijit Ghosh, Berkeley; Anurag Jain, Santa Clara; Michael Leigh Lipsie, Los Gatos; Donald Tarrodaychik, Santa Clara; Osamu Yamamoto, San Jose, all of Calif.

[73] Assignee: Mitsubishi Electric Information Technology Center America, Inc., Cambridge, Mass.

[21] Appl. No.: 328,429

[22] Filed: Oct. 25, 1994

[51] Int. Cl.$^6$ ............... G06F 9/455; G01R 31/28
[52] U.S. Cl. ............ 395/500; 364/578; 395/183.04; 395/183.09; 371/22.5

[58] Field of Search ............... 395/500, 700, 395/800, 183.04, 183.06, 183.09, 828, 883, 183.14, 183.05, 183.1, 183.11, 650, 421.03, 421.11, 470, 485, 280, 376, 183.07, 183.22, 704, 1; 364/578, 133; 371/22.3, 22.2, 22.1, 22.5–24, 22.6

[56] References Cited

U.S. PATENT DOCUMENTS

| | | | |
|---|---|---|---|
| 5,313,618 | 5/1994 | Pawloski | 395/500 |
| 5,327,361 | 7/1994 | Long et al. | 364/578 |
| 5,329,471 | 7/1994 | Swoboda et al. | 364/578 |
| 5,357,628 | 10/1994 | Yuen | 395/183.1 |
| 5,388,060 | 2/1995 | Adams, Jr. et al. | 364/578 |
| 5,438,673 | 8/1995 | Court et al. | 395/500 |
| 5,440,697 | 8/1995 | Boegel et al. | 395/500 |

Primary Examiner—Jacques Louis-Jacques
Attorney, Agent, or Firm—Robert K. Tendler

[57] ABSTRACT

The speed of a hardware-software debugger is markedly increased through the use of high speed simulators which ignore all systems operations except those where design errors are expected to manifest themselves, by skipping CPU bus cycles of no interest for the simulation, by not explicitly simulating periodic clock signals and generating only schedules of clock signals, and by caching instructions when alien computers are used in the simulation process to eliminate decoding of the instructions of the target computer.

3 Claims, 9 Drawing Sheets

```
#define half_cycle 4630
static const unsigned short waves[36][3];  /* Precalculated values for setting
                                              timers: 36 sample points * 3
                                              waves in one sine period */
static short sample_index = 0;
static short stay_at_sample = 100;
static short frequency = 10;
static short half_wave = 0;
static short dead_time = 0;

main(
}

*TRR0 = half_cycle;                /* Initialize TimerP */ sample_index - 0;

while (1) {                        /* main snfinite loop */
    frequency = read_desired_frequency();  /* frequency changes from
                                              10 to 100 (Hz) */
    dead_time - read_desired_dead_time();
  }
} void int0()                        /* interrupt service program */
  {
    register int temp;

temp = dead_time/2;
    if (half_wave == 0) {            /* interrupt #1 in a sampling period */
      if ((stay_at_sample -= frequency) <= 0) {
        stay_at_sample = 100;
        if ((++sample_index) >= sizeof(waves)/sizeof(short))
          sample_index = 0;
      }
      *TimerA = waves[sample_index][0] - temp;
      *TimerA1 = wasves[sample_index][0] + dead_time-temp;
      *TimerB = waves[sample_index][2] - temp;
      *TimerB1 = waves[sawple_index][2] + dead_time-temp;
      *TimerC = waves[sample_index][1] - temp;
      *TimerC1 = waves[sample_index][1] + dead_time-temp;
      half_wave = 1;
    }
    else {
      *TimerA = half_cycle - (waves[sample_index][0] - temp);
      *TimerA1 = half_cycle - (waves[sample_index][0] + dead_time-temp);
      *TimerB = half_cycle - (waves[sample_index][2] - temp);
      *TimerB1 = half_cycle - (waves[sample_index][2] + dead_time-temp);
      *TimerC = half_cycle - (waves[sample_index][1] - temp);
      *TimerC1 = half_cycle - (waves[sample_index][1] + dead_time-temp):
      half_wave = 0;
    }
    return ;
```

Fig. 5

HARDWARE-SOFTWARE DEBUGGER USING SIMULATION SPEED ENHANCING TECHNIQUES INCLUDING SKIPPING UNNECESSARY BUS CYCLES, AVOIDING INSTRUCTION FETCH SIMULATION, ELIMINATING THE NEED FOR EXPLICIT CLOCK PULSE GENERATION AND CACHING RESULTS OF INSTRUCTION DECODING

FIELD OF THE INVENTION

This invention relates to debugging systems and more particularly to a fast hardware and software debugging system involving high speed simulators which ignore all systems operations except those where design errors are expected to manifest themselves.

BACKGROUND OF THE INVENTION

In general, hardware-software co-debuggers, also called system-on-a-chip or SOC Debuggers, are simulation and debugging tools for the design of electronic systems. The tool is capable of simulating a system consisting of custom hardware, Application Specific Standard Products or ASSP's, peripherals, and microprocessors/digital signal processors running software. The primary purpose of this tool is to help the designer detect design errors or bugs in the system software, hardware, and interfaces without having to build the hardware and without resorting to costly system prototyping or emulation. Since desirably such a tool incorporates many high speed simulators, it may also be used in the initial stages of design to determine hardware-software trade-offs. However, the problem with prior simulators is the speed at which they operate. The need to simulate hardware operation makes these debuggers account for every signal change on a system bus and that makes simulated software performance unacceptably low. According to the data of James A. Rowson's paper "Hardware-Software Co-Simulation" in the Proceedings of 1994 Design Automation Conference, the software simulated in a cycle-accurate mode runs only at 50–1000 instructions per second. This is 4–5 orders of magnitude slower than it runs on a target system.

By way of background, shrinking feature sizes have enabled the integration of hundreds of thousands of transistors on a chip. It is therefore possible to integrate more than a million gates using 0.35 micron technology. This tremendous increase in the amount of hardware that can be built on a chip has given rise to the concept of system-on-a-chip in which entire systems are monolithically fabricated in chip form on a single wafer. Embedded systems are the first and natural candidates for SOC implementation because their hardware needs including microprocessor, memory and application-specific circuitry can be met within the limits of SOC technology. Integration, though attractive in terms of overall system cost and performance, presents certain problems related to the debugging of embedded systems. Historically, embedded systems have been developed using off-the-shelf microprocessors, memory and application specific integrated circuits or ASIC's. Once all the components are assembled on a board, designers use in-circuit emulators, or ICE, logic analyzers, and other devices to analyze the behavior of the system and find bugs. However, when the system is integrated on a chip, internal wires are not accessible, and therefore ICE and logic analyzers can no longer be used.

One solution to this problem is to emulate the entire system using field programmable gate arrays or FPGA's. The first drawback of this method is the cost. Not only does the user have to purchase FPGA's, but also FPGA synthesis and mapping tools. In addition, the user may be required to purchase a debugger and other computer-aided software engineering or CASE tools for the microprocessor to be used. Despite these disadvantages, this method is useful when large systems have to be debugged and where emulation speed is important.

The other solution is to simulate the system. Simulation, admittedly, is significantly slower than emulation but it is also significantly less expensive. The added advantage of simulation is that it allows the user to observe the behavior of the system in great detail by going through each simulation step. Therefore, simulation is a key technology for the design and debugging of embedded systems. It is noteworthy that while currently attainable simulation speed may be adequate for the debugging of some systems, it is insufficient for present large scale systems.

More specifically, hardware-software co-debuggers have been developed for use as simulators for electronic systems. These co-debuggers have the capability to simulate hardware, multiple microprocessors and digital signal processors running software, dedicated peripherals, and also the environment with which the system interacts. Therefore, the tool is not limited to the design of any particular kind of electronic system. Note that hardware-software co-debuggers are mostly used in the design of embedded systems.

In a typical design process, system architects first use the system specification to design the overall architecture of the system. Hardware-software trade-offs are evaluated at this stage and system functionality is partitioned between hardware and software. At this architecture design stage, co-design tools like Ptolemy described in an article of J. Buck et al. entitled "Ptolemy: A Framework for Simulation and Prototyping Heterogeneous Systems" published in the International Journal of Computer Simulation, January, 1994, StateMate described in an article of D. Hart et al. entitled "STATEMATE: A Working Environment for the Development of Complex Reactive Systems" published in IEEE Transactions on Software Engineering, April 1990, and Tsutsuji described in an article of W. Culbertson et al. entitled "The HP Tsutsuji Logic Synthesis System" published in Hewlett-Packard Journal, August 1993, are useful. Moreover, a hardware-software co-debugger can be used at the architectural design stage as well.

After system architecture design, hardware and software design proceeds in parallel. The interface specifications are to be clearly laid out and hardware and software are designed in isolation, but adhering to the interface specifications. Some debugging can be performed at this stage. For hardware, commercial simulators can be used for debugging. For software, many procedures can be debugged using software engineering tools. It is important to note that the hardware and the software are debugged in isolation, and therefore, bugs arising out of the interaction of hardware and software cannot be found. Especially, if there is a closed loop interaction between a piece of software and some application-specific hardware, neither the software nor the hardware can be debugged at this stage.

After preliminary design of system hardware and software, a hardware-software co-debugger can be used to simulate and debug the entire system. The user can probe processor state, ASIC state, set breakpoints in the software or in hardware and analyze timing relationships. Special software called actors are used to apply stimulus to the system and to observe the behavior of the system. Therefore, these actors model the environment in which the system is supposed to work. The accuracy of the models used for the microprocessor, the peripherals and for the application-specific circuitry determine the accuracy of the simulation. However, the more accurate the model, the slower the simulation. The user can choose the level of accuracy of simulation by choosing the appropriate model and simulator to use.

The problem with all of the above hardware-software co-debuggers is the time required for the simulation. Typically for a reasonably complex system such as a DOS operating system designed to run at 10–100 MIPS (millions of instructions per second), simulators for debugging pure software operation at instruction level typically run at an equivalent speed of 20 KIPS (thousands instructions per second), three orders of magnitude slower. With hardware-software co-simulation that is necessary for debugging embedded systems, the speed goes down to 0.05–1 KIPS which is another 1–2 orders of magnitude down from the speed of a target system. Thus for a keystroke command, the response time is on the order of seconds. This is of course frustrating for personnel engaged in the debugging process. It is therefore desirable to reduce the response times.

SUMMARY OF THE INVENTION

The Subject Debugger achieves a 50–100 speed advantage over prior debuggers by being able to ignore most of the instructions which would normally be simulated. This is accomplished by skipping CPU cycles that do not include hardware-software interaction, while at the same time directly accessing memory locations in memory simulator address space. Additionally periodic signals are not explicitly simulated so that not all clock pulses are generated. This eliminates unnecessary event activity and loss of time. Finally, decoded instructions of a target computer are cached for reuse, when the simulation host computer is different from the target computer normally used to run the software. All of the above contribute to the significant time savings achieved by the subject debugger. This is especially true in hardware-software co-debugging operations which utilize multiple simulators under control of a simulation manager.

In summary, the speed of the subject hardware-software debugger is markedly increased through the use of high speed simulators which ignore all systems operations except those where design errors are expected to manifest themselves, by skipping CPU bus cycles of no interest for the simulation, by not explicitly simulating periodic clock signals and generating only schedules of clock signals, and by caching instructions when alien computers are used in the simulation process to eliminate decoding of the instructions of the target computer.

BRIEF DESCRIPTION OF THE DRAWING

FIG. 5 is a program listing for use by the CPU of FIG. 3 for providing the pulse with modulation sequence of FIG. 4;

DETAILED DESCRIPTION

Figure 1:
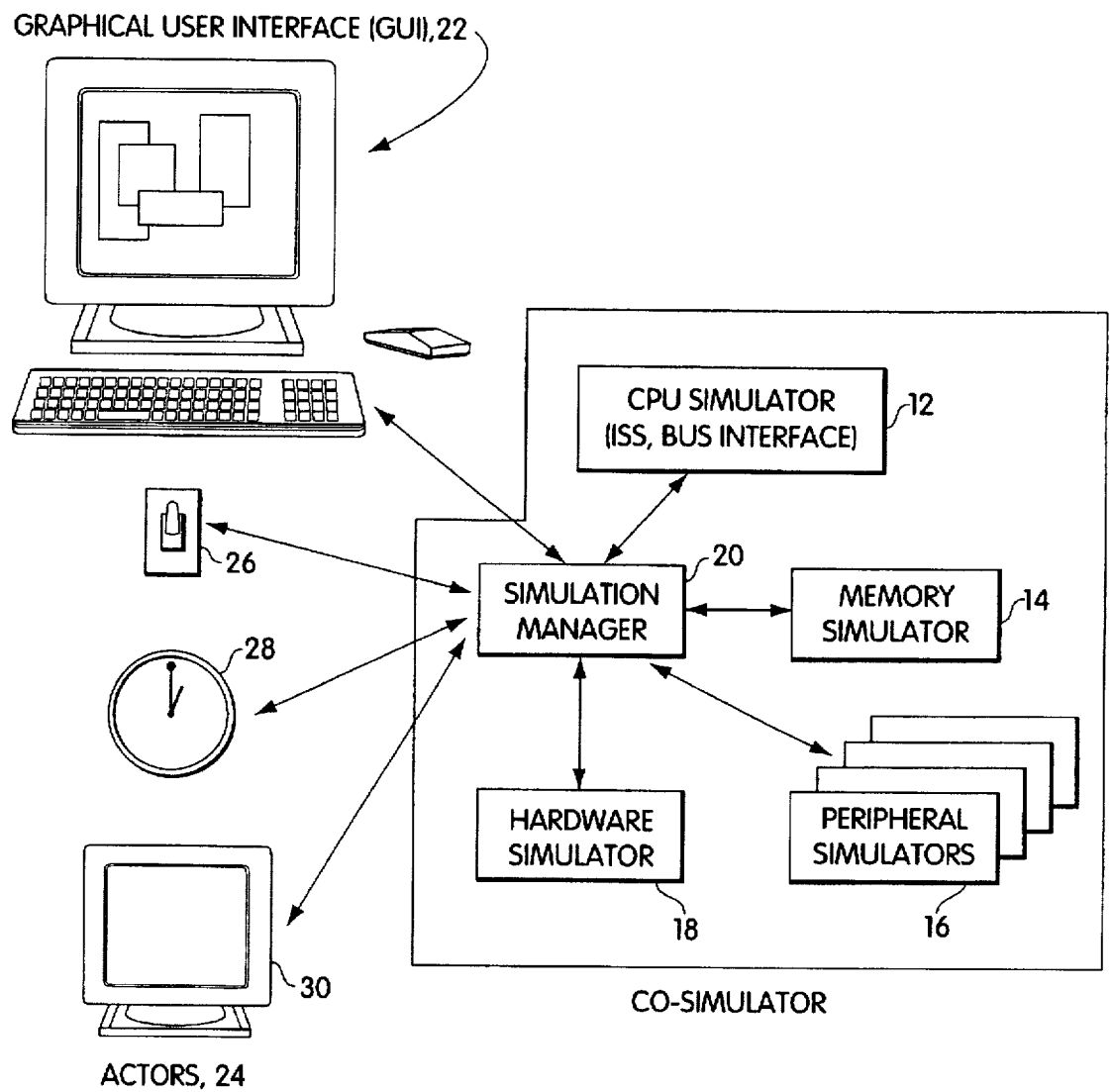
FIG. 1 is a block diagram and diagrammatic illustration of the co-simulator used in the simulation process, also illustrating a graphical user interface and actors.

Prior to describing those features of the Subject Debugger which permit a 50–100 fold increase in speed, it will be appreciated that the subject hardware-software co-debugger is designed so that it can be used to simulate a particular electronic system. In essence, the debugger is a simulation backplane that hosts a number of different simulators, each intended to simulate a specific part of the system. Thus, as shown in FIG. 1, a hardware-software co-simulator 10 is a collection of different simulators 12, 14, 16 and 18 for simulating different components of the system. There are simulators such as simulator 12 for simulating microprocessors running software, simulators such as simulator 18 for hardware and simulators such as simulator 16 for application-specific standard components such as peripherals. These simulators are integrated using an efficient simulation backplane called a simulation manager 20.

The co-debugger consists of at least two processes. One of them is a graphical user interface 22 and the other is co-simulator 10. In addition, the simulators utilize actors, here illustrated at 26, 28 and 30 which represent sensors and actuators for the system under debugging. Note, each 24 actor is a separate process, with the processes communicating with each other and are therefore capable of running on separate computers in a network of workstations.

For purposes of explanation, an actor is a graphical object that represents some component of the environment. Actors thus model the sensors from which the system receives inputs and also model the actuators to which the system sends its output. Each actor can model one or more sensors and/or actuators. Each sensor or actuator in the actor is called an actor parameter. Some actors model only sensors and are called input actors such as a gas pedal; while some others contain model only actuators and are called output actors such as a meter. Some actors contain both sensor and actuator parameters, such as a motor that has a sensor for the r.p.m. and a control input that controls the r.p.m. A library of actors modeling many mechanical and electro-mechanical components is provided with the co-debugger, with these actors being easily modified and new actors based on the current set of actors developed relatively easily.

Co-simulator 10 consists of the simulation manager and various simulators. There are simulators for microprocessors, digital signal processors, dedicated peripherals, memory modules, as well as simulators for application-specific hardware. The simulation manager not only serves as a backplane for various simulators to communicate with one another, but can also execute simulation control and debugging commands.

In order to be integrated into the backplane, each simulator is required to implement a set of functions. Simulators also have access to a set of functions implemented in the simulation manager. These sets of functions constitute the interface specification for simulators, so that any simulator adhering to these specifications can be integrated into the co-simulator.

One can choose the level of accuracy of simulation by choosing the appropriate simulators and the level of abstraction for the description of hardware. For example, by choosing a behavioral model for a piece of hardware instead of a structural model, the user can increase simulation speed at the cost of loss of timing accuracy.

Since different simulators are used to simulate different components of the system, each simulator has to be used to debug the particular component it is simulating. Therefore, the user has to issue commands to individual simulators to control simulation and display the appropriate debugging information. In one embodiment, each simulator has its own command interpreter, with each command interpreter understanding commands only for the particular simulator it belongs to.

At start-up and during simulation, the control in co-simulator 10 usually resides in simulation manager 20. Simulation manager 20 periodically calls different simulators and passes control to these simulators. The simulators simulate for a given period of time and then pass control back to the simulation manager, which might call other simulators or prompt the user for more commands. However, when a particular simulator has control, it might reach a breakpoint and decide to prompt the user for commands. Therefore at any point where a user sees a prompt, the control could be either in the simulation manager or in one of the simulators. Depending on where the control is, the corresponding command interpreter would be interpreting the commands. The user can determine where the control is by looking at the prompt. The user may also decide to send commands to another command interpreter by specifying commands destination explicitly.

The system described above is functionally sufficient to perform hardware-software co-simulation and co-debugging. However, as stated before, inadequate simulation speed could make such debugging frustrating and hardly fitting into the aggressive development schedules of today's industrial research and development.

Figure 2:
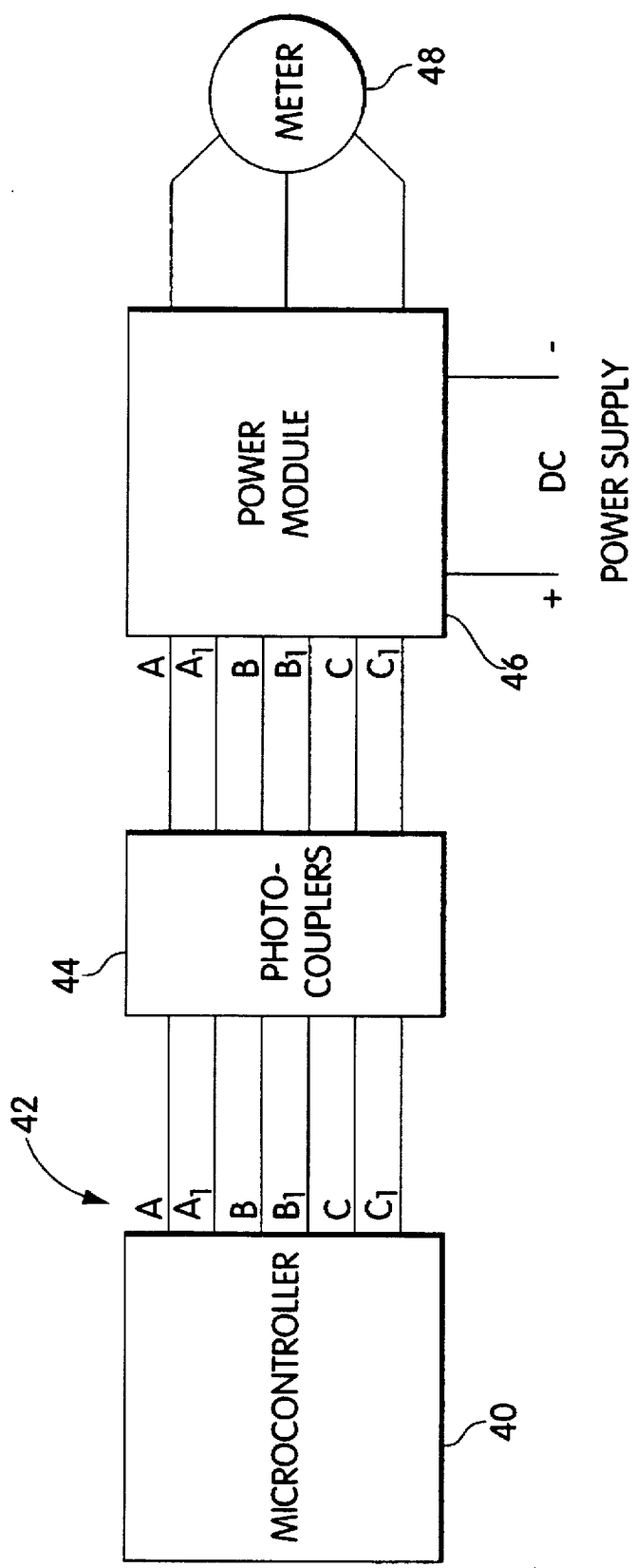
FIG. 2 is a block diagram of a typical micro processor controlled motor drive circuit.

To illustrate the problem consider an example of a microcontroller-based logic circuit for speed control of a 3-phase electric motor. General structure of such system is presented in FIG. 2. In this system a microcontroller 40 is used to produce the discrete values 42 of a sine function with a desired frequency and 120 degrees phaseshift between three line voltages (A, B, and C) of a three-phase motor. Each discrete value of sine is represented using the method of pulse-width modulation (PWM) and both positive polarity (A, B, C) and negative polarity (A1, B1, C1) pulses are produced. The PWM sequences are fed through photo-couplers 44 into a power module 46 that directly drives a motor 48 so that its rotation speed is proportional to the frequency of sine wave produced and encoded by microcontroller 40. Throughout this discussion the emphasis will be on the design issues of microcontroller hardware, shown in FIG. 3 and software. The details of power circuit design are described in the book by Irving M. Gottlieb entitled "Electric Motors and Control Techniques", second edition, published by TAB Books, Division of McGraw-Hill Inc. in 1994, Pages 148–164.

Figure 3:
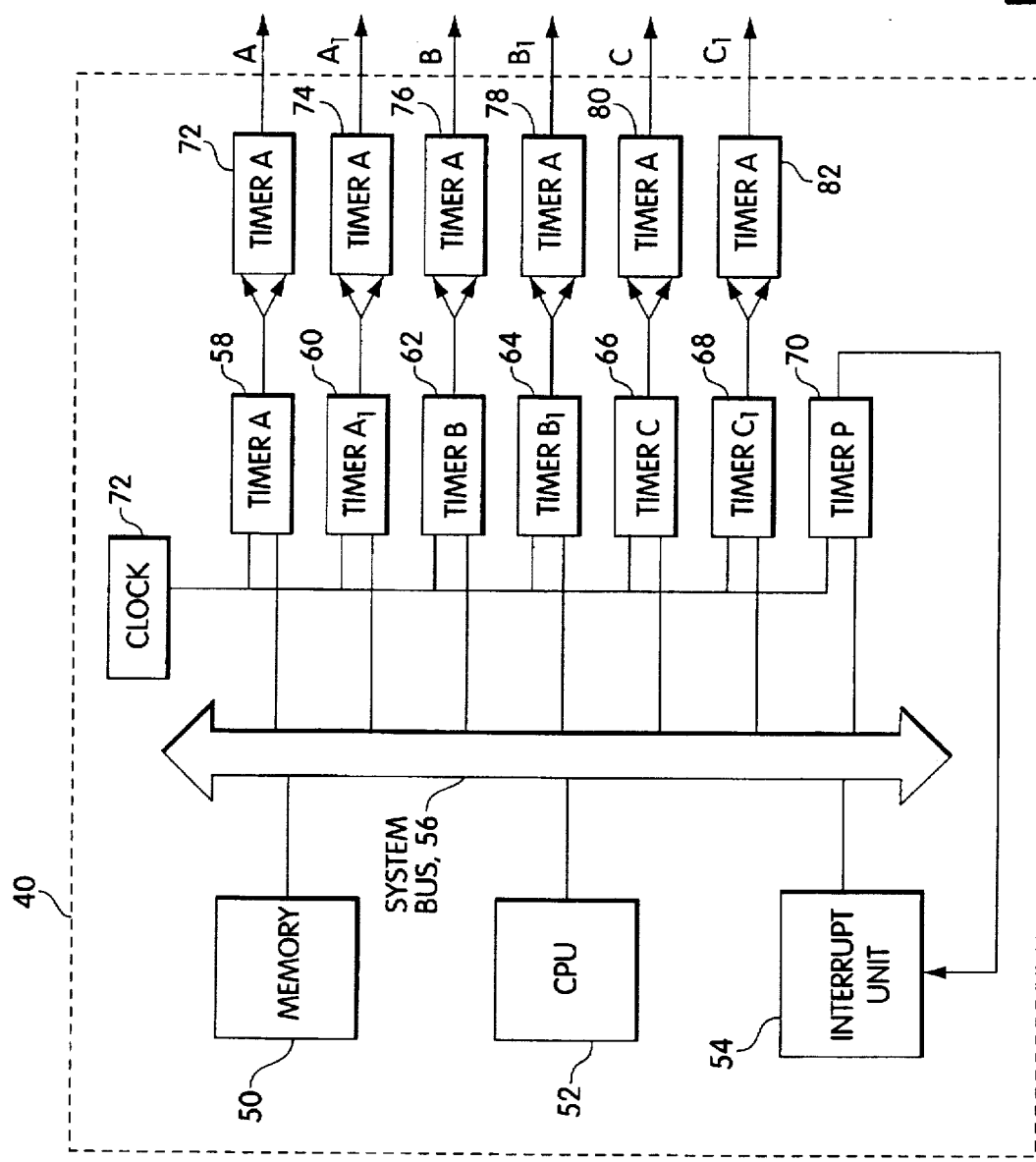
FIG. 3 is a block diagram of the micro controller of FIG. 2 illustrating timers and associated flip flops coupled to a system bus under control of the system CPU.

In FIG. 3, memory 50, CPU 52 and interupt unit 54 are coupled via a system bus 56 to various timers 58, 60, 62, 64, 66, 68 and 70 each clocked via a clock 72. Note that timer 70 is coupled directly back to interrupt unit 54. As can be seen, each of the timers, 58, 60, 62, 64, 66 and 68 are coupled to respective flip flops 72, 74, 76, 78, 80 and 82 to provide the discrete values 42 of the aforementioned sine function.

Figure 4:
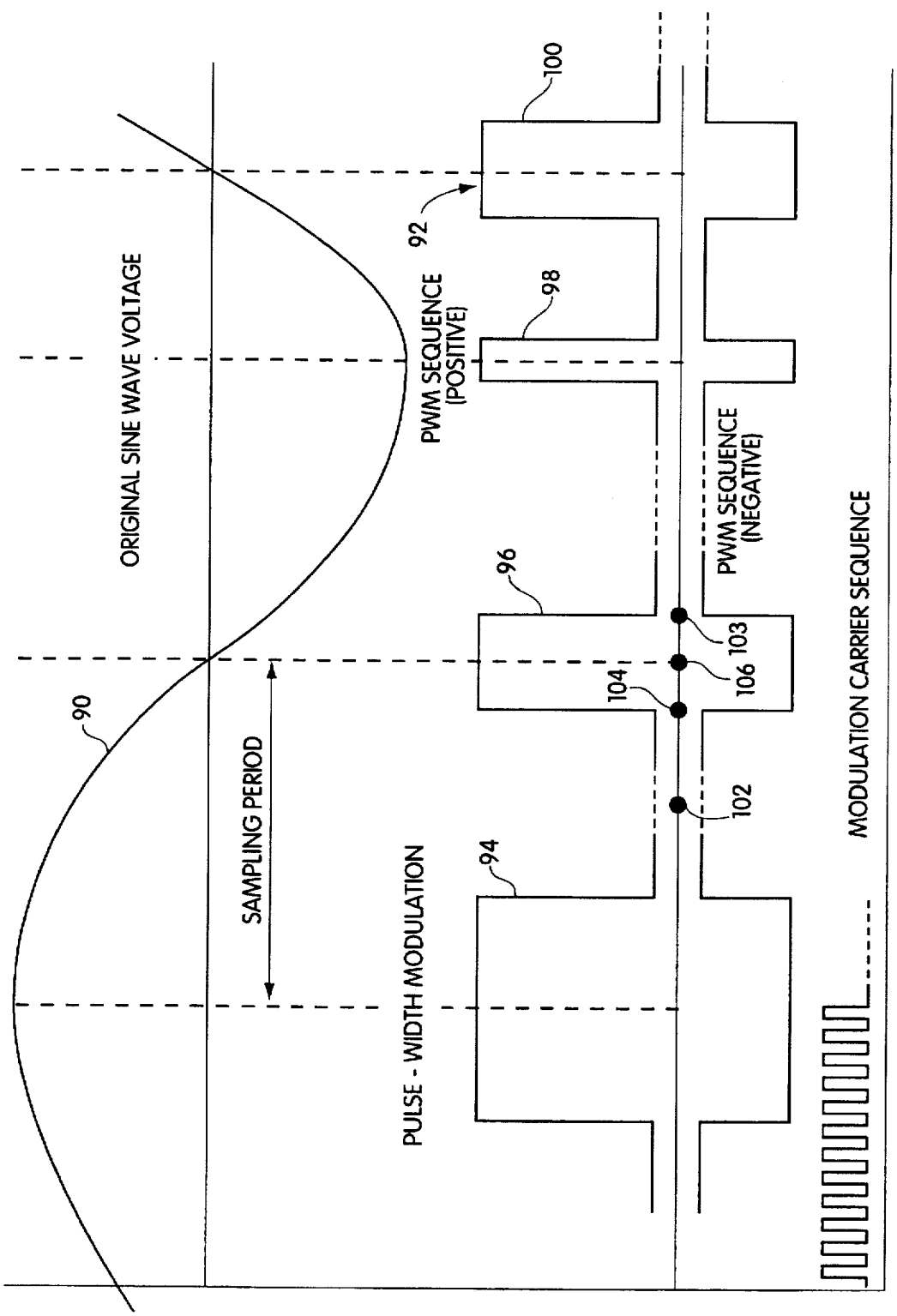
FIG. 4 is a wave form diagram of the original sine wave to be simulated, along with the pulse with modulation sequence.

Referring now to FIG. 4, this figure illustrates the principle of pulse width modulation (PWM). The desired voltage curve 90 is represented with a sequence 92 of its discrete values separated by a fixed time interval called a sampling period. A typical value of sampling period is $1/3600$ of a second. In other words, a typical sampling frequency would be 3.6 KHz. Each discrete value of the voltage is represented by a pulse 94, 96, 98 and 100. The width of each pulse taken as a fraction of the sampling period is proportional to the voltage value it represents. Typically, pulse widths of half of the sampling period and more are representing positive voltages, and the widths less than a half of sampling period are representing negative voltages. In other words, the voltage value 0 will be represented in PWM with the pulse that has width equal to the half of sampling period or $1/7200$ of a second. Maximum positive voltage will be represented with the wide pulse approaching the duration of sampling period, and maximum negative voltage is represented with the narrowest possible pulse. As is well known, time intervals including pulse durations are best represented in such systems by counting the number of pulses of a much higher modulation carrier frequency. The modulation carrier pulse sequence is shown at the bottom of FIG. 4 by reference character 10. Clearly, each PWM pulse can be measured by the number of modulation carrier periods that fit into the same interval and the higher carrier frequency, the more accurate PWM representation will be. In this example of a motor controller, the carrier frequency is taken to be 33 MHz which corresponds to carrier period of 30 ns. In this case, for example, 0 voltage level corresponds to the pulse width of $1/7200$ of a second or of 4630 units of carrier period.

Turning back now to FIG. 3, to see how PWM modulation is performed by a microcontroller, microcontroller 40 consists of central processing unit (CPU) 52 to execute the program instructions through various types of system bus transactions, memory to store instructions and data, six timers 58–68 namely TimerA, TimerA1, TimerB, TimerB1, TimerC, TimerC1 each connected to a toggle flip/flop 72–82 that actually produces a PWM sequence on a corresponding line, and another timer 70, namely TimerP, connected to an interrupt unit.

The microcontroller operates as follows. Initially TimerP is set to divide the 33 MHz carrier frequency by 4630. As a result it produces an interrupt of the CPU every $1/7200$ of a second or twice every sampling period. At the first interrupt, point 102 in FIG. 4 each of the six timers is programmed for a number of carrier cycles that correspond to the time interval until the next pulse of PWM sequence has to start, e.g. namely the interval between points 102 and 104 in FIG. 4. At the second interrupt, point 106, each of the six timers is programmed for a number of carrier cycles until the current pulse has to end e.g. as shown at point 108. After counting the number of cycles it is programmed for, each timer produces a single pulse that toggles the corresponding flip/flop. The initial state of flip/flops on lines A, B, C is set to 0, and the initial state of flip/flops on lines A1, B1, C1 is set to one. This way toggling flip/flop twice during the sampling period will produce positive pulses on lines A, B, and C and negative pulses on lines A1, B1, C1. Note that separate timers are necessary for lines A1, B1, C1, rather than simple invertors of the values on lines A, B, and C, because simultaneous switching of positive and negative PWM lines may result in damaging the power circuit. A detailed explanation of this circuit can be found in the above mentioned book by Irving M. Gottlieb, Pages 148–164. The algorithm of proper selection of the values to which the timers need to be programmed at each of the successive sampling intervals is implemented by the microcontroller software. The listing of such software in C language is shown in FIG. 5. For description of C language see the book by B. Kernigan, and D. Ritchie "The C Programming Language. Second Edition." published by Prentice Hall in 1988.

It consists of an initialization part that executes only once, a background program that runs continuously in infinite loop and has the purpose of setting the desired values of motor rotation frequency and the dead time delay between switching of corresponding positive and negative PWM signals, and an interrupt service program that executes every time the interrupt signal comes from the TimerP.

Figure 6:
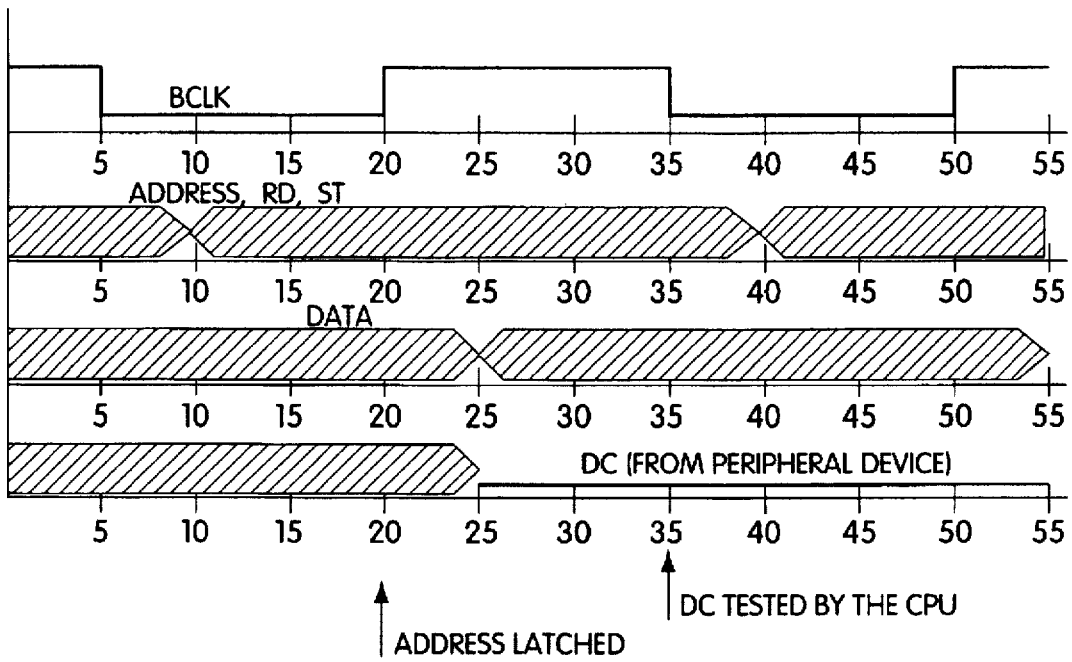
FIG. 6 is a wave form diagram illustrating the bus right operation for the system bus of FIG. 3.
Figure 7:
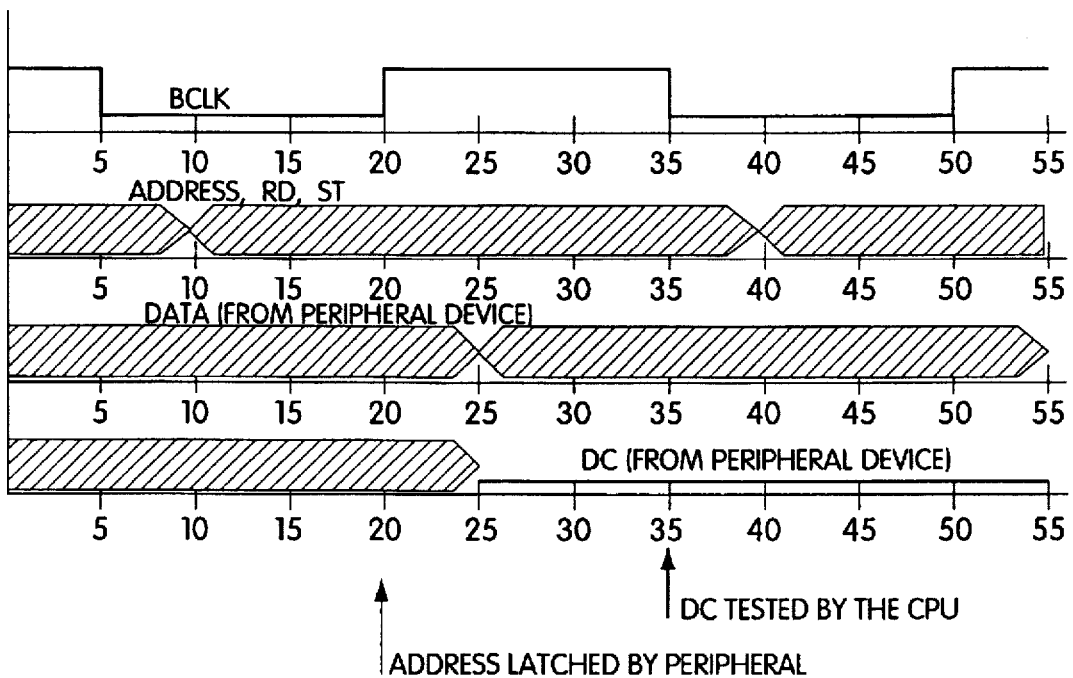
FIG. 7 is a wave form diagram of the bus read operation for the system bus of FIG. 3.

CPU 52 executes software by performing system bus transactions shown in FIGS. 6 and 7 where BCLK is the same 33 MHz clock signal as PWM modulation carrier, address (32 bits), data (32 bits), RD, ST, DC are various signal lines of a system bus that carry the information involved in read or write transactions. It can be appreciated that as CPU 52 is continuously running, this means that up to 4630*2=9260 cycles are executed by the CPU each sampling period in addition to 7*4630*2*2=129640 events processed by the timers due to 2 transitions of input of each timer each carrier frequency period. It should be appreciated further that the speed one can expect from a CPU simulator in a cycle-accurate mode is 50–1000 cycles per second. The number of events the general event-driven simulator of a timer circuit can typically process per second is of the order of 10000–30000. This means that the simulation of one sampling period of PWM modulation can take around 3 minutes. Furthermore, if desired rotation speed of the motor is 600 RPM then the simulation of one motor shaft revolution could take up to 18 hours. Clearly, such long simulation time of a relatively very simple system is unacceptable.

One way to drastically reduce the simulation time is to carefully select those CPU cycles that are really necessary to be simulated at a true cycle-accurate level. The justification for this approach comes from the fact that very different speed 20000 vs. 50–1000 cycles per second, can be achieved in a simulation run where all signal changes on a system bus are not carefully reproduced according to FIGS. 6 and 7.

Rather only the final state of memory 50 and CPU 52 after execution of each instruction is recorded. If only this type of simulation, so called instruction level simulation, of CPU 50 is performed for the example of motor control, then the CPU simulation time for one sample would go down to 9260/20000=0.463 s, or for one shaft revolution at 600 RPM down to 166.7 seconds, which is considerably reduced from 18 hours. This, however, is not possible because some cycles executed by the CPU involve transactions between the CPU and the timers and those cycle have to be simulated accurately according to FIGS. 6 and 7. Or else the correctness of control of the timers will not be verified by system simulation.

Figure 8:
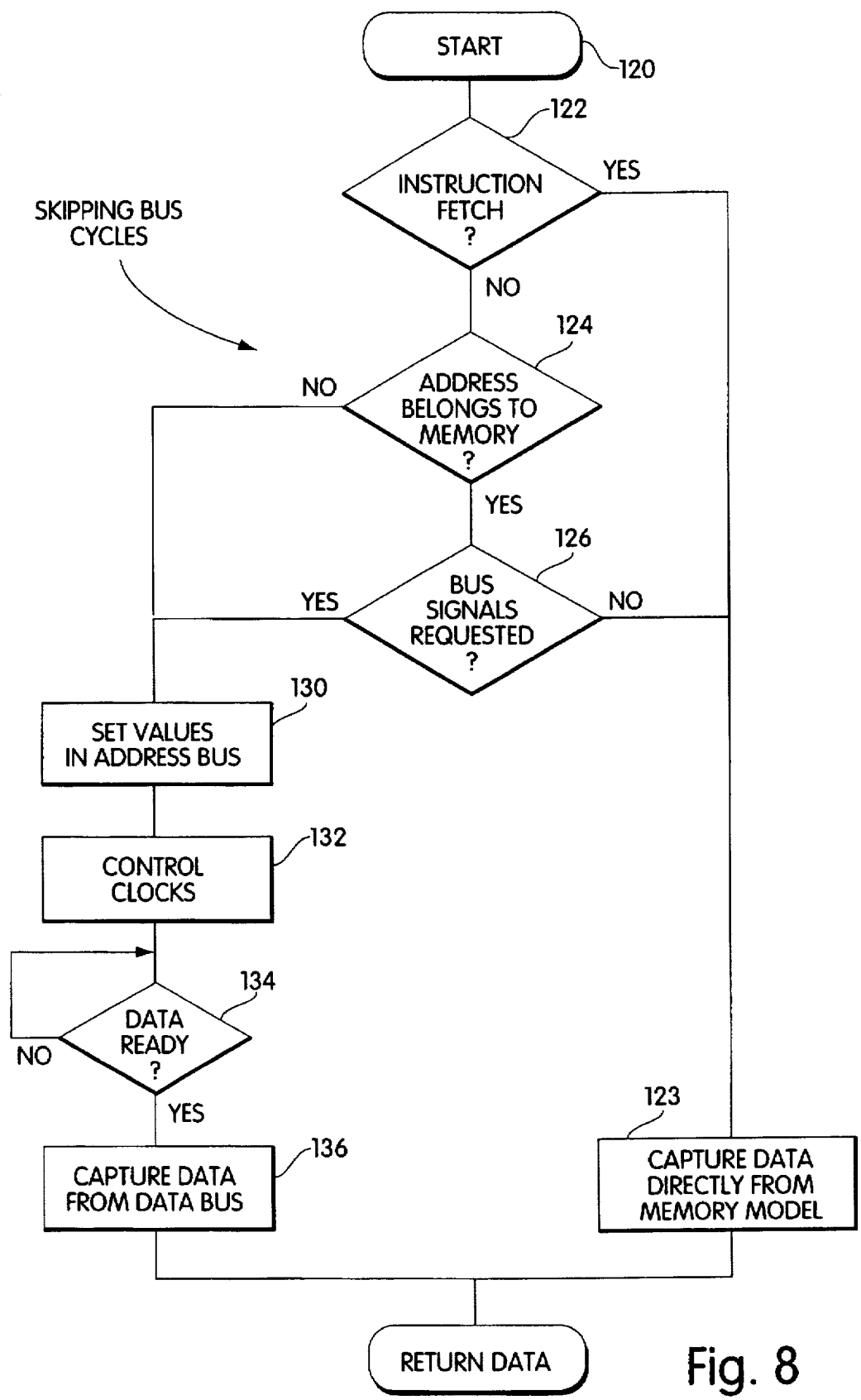
FIG. 8 is a flow chart of the algorithm for use in the CPU of FIG. 3 in which each CPU signal is evaluated as to whether it is an instruction situation or a data access signal.

The solution to this problem lies in the algorithm presented in FIG. 8. According to this algorithm each CPU cycle is evaluated when starting at 120 according to two basic criteria: whether it is an instruction fetch 122 in which case data is captured directly from the memory model as illustrated at 123, or a data access cycle, and, if the latter is true, whether the data access is to memory as illustrated at 124 or to peripheral devices address space as illustrated at 130, 132, 134 and 136. All instruction fetches and data accesses to memory are not simulated on a detailed level but only final result of transaction is calculated. On the contrary, accesses to peripheral address spaces are simulated according to the system bus protocol of FIGS. 6 and 7. An exception in this algorithm is made for the case when the simulator user is specifically requesting complete simulation according to the bus protocol as illustrated at 126. However this is only required in those rare cases when CPU-memory transactions are being debugged.

Turning back to FIG. 5 one can estimate the effect that the use of the proposed algorithm of FIG. 8 will have on CPU simulation time for an example of a motor control system. The examination of the interrupt service program of FIG. 5 indicates that there are only 6 CPU cycles through each execution of this program, where in fact the access to peripheral address space, specifically timer address space, is taking place. As this program is executed twice per sample one can conclude that only 12 out of the total of 9260 CPU cycles per sample or 0.13% of the cycles, need to be simulated accurately according to FIGS. 6 and 7. As a result, total CPU simulation time according to the proposed algorithm of FIG. 8 is 12/50+9248/20000=0.465 s per sample or 167.4 s per shaft revolution at 600 RPM.

The CPU simulation time in view of the algorithm of FIG. 8 is mostly determined by the pure instruction level simulation speed that can be achieved. This speed, 20 KIPS, is markedly much slower than the performance of most modern engineering workstations that can be used as platforms for running the simulator. It is not uncommon now for those engineering work stations to demonstrate a speed of 70–100 MIPS, or 3000–5000 more than the speed of instruction simulation. The reason for this speed difference is that the instructions of a target CPU used in embedded control systems like the one for 3-phase motor control are not directly understood by the processors of engineering work stations and have to be translated into the sequences of engineering work station instructions before each execution.

In other words, the target CPU for which a software being debugged is written like the one in motor speed control system is alien to the CPU in engineering work stations where the simulation is running. There are two known solutions to this translation problem. One is based on a binary compilation technique. In this case translation of the instructions of the target CPU into the instructions of the engineering work station is done as a separate step and the result of translation is recorded in a file. During the actual simulation this file is loaded and executed. This technique provides for fast simulation but requires an additional step of binary translation every time any changes are made in microcontroller software. The necessity of this step increases the total turnaround time of bug fixing and retesting and makes the whole process less flexible.

The other, more popular technique, requires an on-line translation or interpreting of every instruction of the target CPU as soon as it is fetched from the sequence of instructions that constitutes a program. This approach is quite flexible and convenient but it slows the speed of software simulation to the above mentioned value of approximately 20 KIPS.

The pure interpretive approach demonstrates the worst possible behavior when the system is repeatedly executing the same sequence of instructions again and again as is the case for the program of FIG. 5. In such a program, the same sequence of instructions is repeatedly translated, although neither the source nor the result of such a translation changes from one execution to another in this repetitive cycle.

Figure 9:
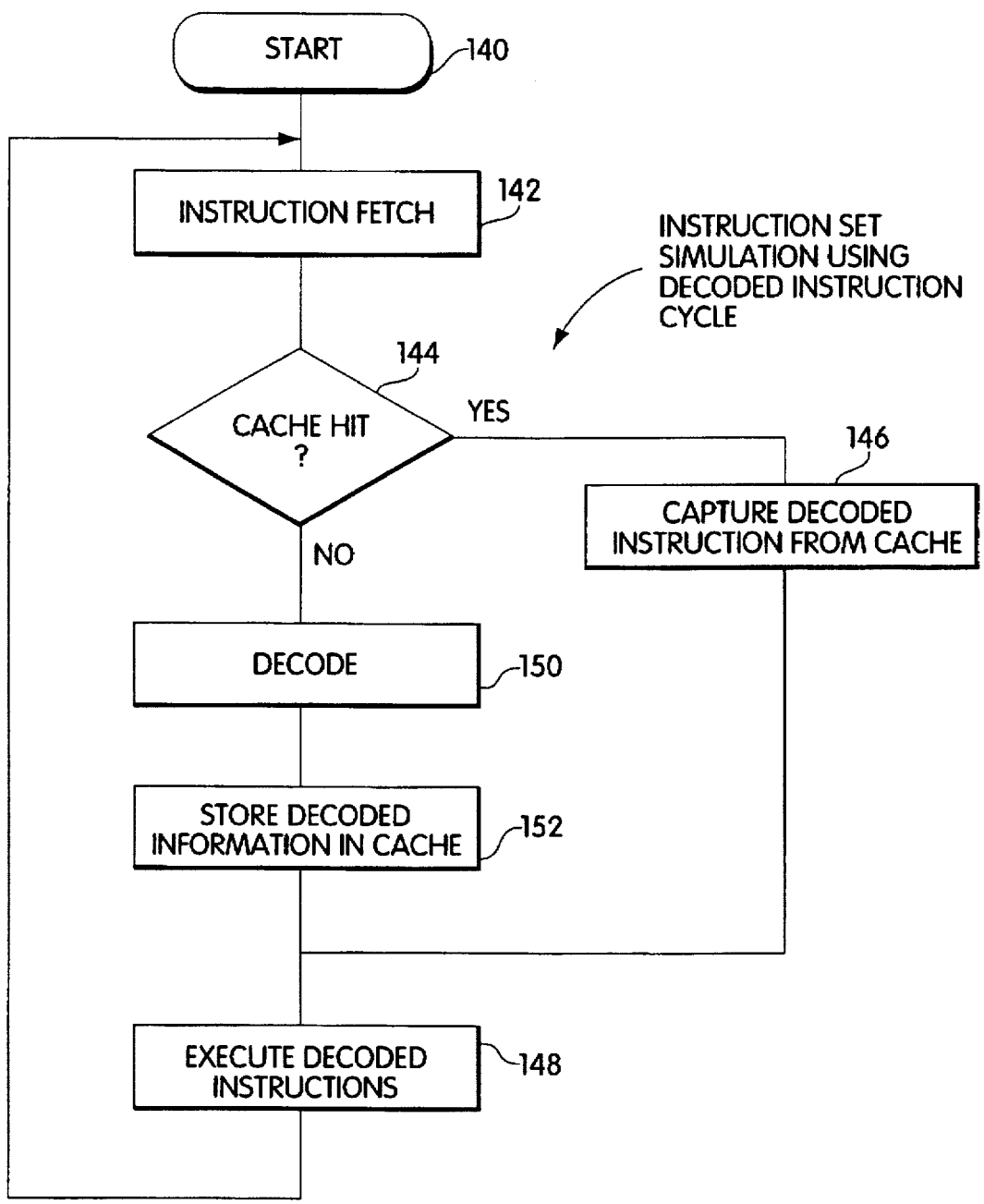
FIG. 9 is a flow chart of an algorithm for use in the CPU of FIG. 3 for improving the performance of a program in which instructions are repeatedly translated by introducing a cache in an engineering workstation for temporary storage of translated or decoded instructions of the target CPU to eliminate duplication.

As can be seen performance is significantly improved by the method described in FIG. 9. This method introduces a cache, or a special dedicated memory area in the engineering work station running the simulation for temporary storage of translated or decoded instructions of the target CPU. As illustrated at 140, 142, 144, 150 and 152 the first time a translation is done, the results are recorded in cache. The next time the same instruction is encountered, it is not translated again but instead the results of such translation are retrieved as illustrated at 146 from cache in the form ready for reuse as illustrated at 148. Note, if there is no information in cache about a given instruction then it is decoded as illustrated at 150 and the decoded information is stored in cache as illustrated at 152. Of course, this method is "double-edged". If the structure of the program does not provide for repetitive execution of the same instructions, then maintaining cache results in an additional slowdown of execution. However, for typical embedded controller software like the one illustrated in connection with FIG. 5, the speed resulting from using the algorithm of FIG. 9 has been measured experimentally to be 2.5 times faster, which brings the execution speed to 50 KIPS. In the example of motor speed control this would reduce the CPU simulation time further to 12/50+9248/50000=0.425 s per sample, or to 153 s per shaft revolution at 600 RPM.

As CPU simulation time can be drastically reduced using the methods illustrated in FIGS. 8 and 9, it is necessary to turn to the second component of system simulation time which is the time to simulate peripheral devices and the hardware in general. As the calculation above has shown for an example of motor speed controller the simulation of timers requires processing of 129,640 events per voltage sample which for a typical hardware simulator takes up to 13 seconds. For simulation of one shaft revolution at 600 RPM this would take 78 minutes. This does not seem a lot compared to 18 hours of simulation time required when the CPU has been simulated in a straightforward manner, but with the CPU simulation reduced to just over 2.5 minutes the portion required for the timers becomes critical.

Figure 10:
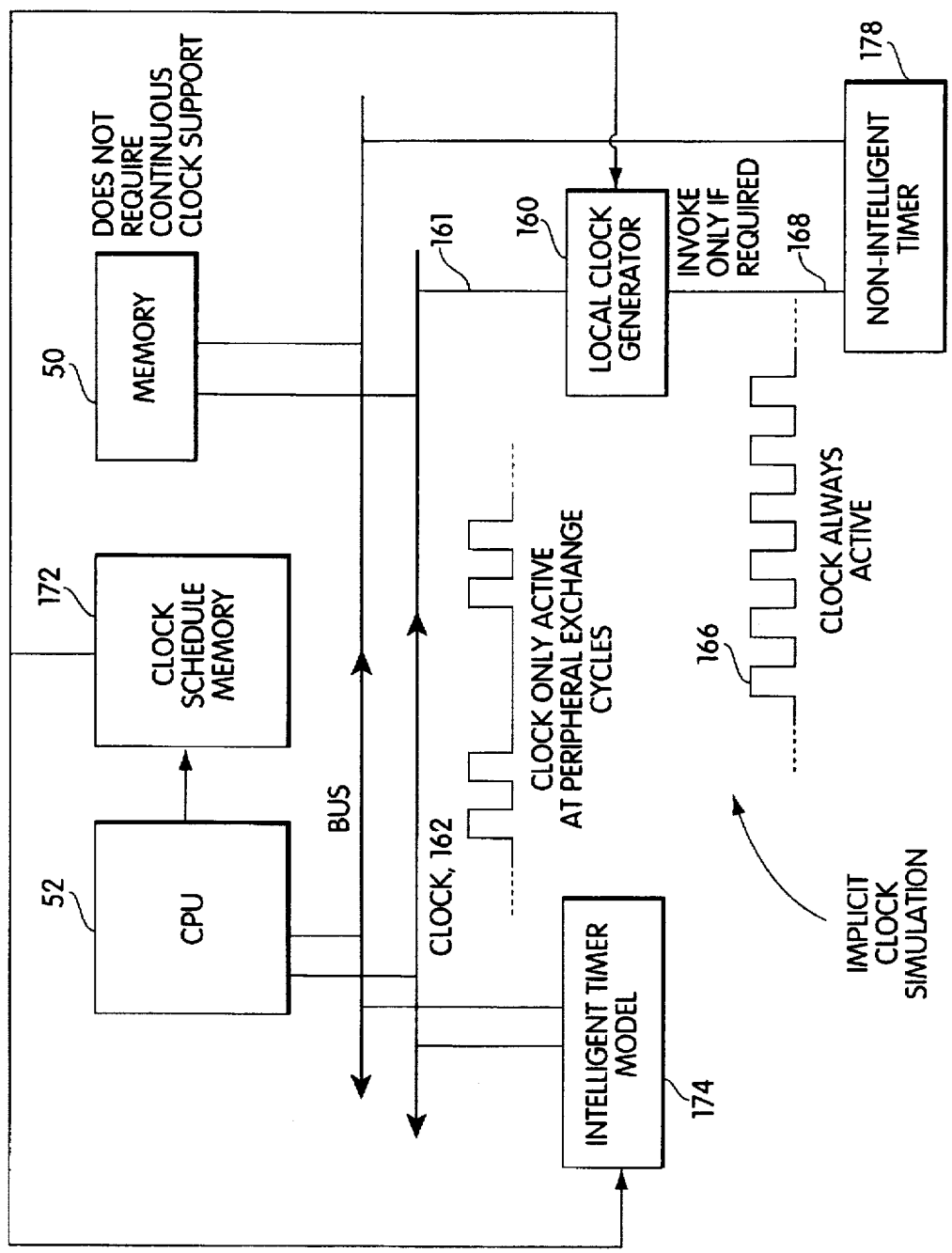
FIG. 10 is a block diagram for the non-explicit simulation of periodic signals that have a static time diagram in which the CPU of FIG. 3 is utilized along with a clock schedule memory and an intelligent timer model to broadcast the clock schedule to all simulators that depend on it, thus to memorize clock pulse generation and transmission.

The time for hardware simulation can be significantly reduced through non-explicit simulation of periodic signals that have a static time diagram. The example of such a signal is the PWM modulation carrier signal of FIG. 4 which is fed to the inputs of all timers of FIG. 3. Instead of in fact simulating the clock line switching on and off every clock carrier cycle, a clock source simulator is used to simulate clock 72. In one embodiment illustrated in FIG. 10, CPU 52 acts as a clock source to broadcast the clock schedule at initialization time to all simulators that depend on it. Such a schedule in a preferred embodiment is placed into a clock schedule memory 172, with the schedule consisting of the clock period, the delay of a positive edge from the start of a period, and a delay of the negative edge from the start of a period. Other embodiments of a schedule representation can be easily derived from this preferred embodiment. Given the clock schedule, an intelligent timer model 174 in the co-simulator directly calculates the projected time it will take to exhaust the number of cycles it was programmed for and to schedule the single output event at that time. This reduces the number of events each timer has to process per one sample value to those required to reprogram or reload its initial value twice in a sampling period. Examination of the timing diagram of FIG. 6 brings this number to 70 per write transaction, or 140 per sampling period per timer, or 140*6= 840 per sampling period for all timers. This means a simulation time of 0.084 s per sample or 30.2 s per shaft revolution at 600 RPM.

It will be appreciated that to allow for such a speedup, certain intelligence has to be built into the timer simulator which is normally not required from the hardware models built for synthesis. In the case of a system model that includes both types of simulators, clock events can not be completely forgone because models with no intelligence to understand the broadcaster clock schedules will not be able to function. To overcome this difficulty a special simulated block, and referring now to FIG. 10, a so called local clock generator 160, or CG is introduced. The function of this block is to convert an implicit clock 162 at its input 164 which is defined by broadcasting its schedule, through placing it into clock schedule memory 172 into an explicit clock signal 166 at its output 168 which is coupled in one embodiment to a non-intelligent timer model 178. Note that such output can then be fed into the models that by themselves do not have an intelligence to recognize an implicit clock. As a result of this solution to explicit clock simulation, though in some systems explicit clock simulation is not eliminated completely, explicit clock simulation can be provided only to the models that are not able to process an implicit clock. As an additional feature, the local clock generator can have a control input that allows implicit to explicit clock conversion to be turned off and on whenever it is likely that the simulation of the model driven by this clock may produce useful results.

To conclude the examination of an example of 3-phase motor speed control system, it will be appreciated that overall system simulation time due to the above described simulation method is reduced from 18 hours to just over 3 minutes, or a reduction in simulation time of 1/360. In an average system one can conservatively estimate simulation time reduction due to this invention to be between 1/50 and 1/100 of that normally encountered.

Having above indicated several embodiments of the Subject Invention, it will occur to those skilled in the art that modifications and alternatives can be practiced within the spirit of the invention, It is accordingly intended to define the scope of the invention only as indicated in the following claims.

We claim:

1. A system for increasing the speed of a hardware-software debugger for debugging a target system having a CPU, a memory, and a number of hardware modules, a interconnected with a bus, comprising:

means for simulating said target system including a CPU simulator, a memory simulator, a number of simulators for said hardware modules, and a simulation manager coupled to said CPU simulator, said memory simulator and said number of simulators for said hardware modules for executing simulation control and debugging commands periodically calling different simulators and passing control to the appropriate simulator;

a bus simulator for interconnecting said hardware module simulators, said memory simulator and said CPU simulator, said bus providing signals corresponding to bus cycles; and means for skipping bus cycles not necessary for simulation wherein said skipping means includes means for determining whether there is an instruction fetch on said bus, or a data access cycle on said bus, and if there is a data access cycle, determining whether bus operation for said data access cycle is for said memory rather than one of said hardware modules, whereby it is not necessary to interpret every bus signal by avoiding instruction fetch simulation and whereby the speed increase is due to skipping unnecessary cycles.

2. The system of claim 1 and further including a clock source simulator for generating schedules of periodic clock signals at initialization times to provide repetitive simulation of said periodic clock signals, and means coupled to said bus for decoding said schedule and for producing a local set of clock pulses at the time determined by said schedule, whereby all clock pulses need not be explicitly generated.

3. The system of claim 1 wherein the program running on said CPU involves repetitive execution of the same instruction, and further including a cache for temporary storage of decoded instructions and for retrieval thereof by translation, such that after a first decoding is done, the next time said same instruction is encountered only the results of the translation of said some instruction are retrieved from said cache, thus to take advantage of the caching of the results of instruction decoding.

* * * * *